United States Patent [19]

Baechtold et al.

[11] 4,186,441
[45] Jan. 29, 1980

[54] MAGNETIC VORTEX GENERATOR WITH A VORTEX POOL AND SINGLE VORTEX TRANSFER

[75] Inventors: Werner Baechtold, Langnau; Pierre Gueret, Richterswil, both of Switzerland

[73] Assignee: International Business Machines Corporation, Armonk, N.Y.

[21] Appl. No.: 957,941

[22] Filed: Nov. 6, 1978

[30] Foreign Application Priority Data

Nov. 14, 1977 [CH] Switzerland ................ 13830/77

[51] Int. Cl.² ................................................ G11C 11/44
[52] U.S. Cl. ..................................... 365/160; 307/306
[58] Field of Search ................ 365/160, 161, 162; 307/306

[56] References Cited

U.S. PATENT DOCUMENTS

3,936,809  2/1976  Zappe ................................ 365/161
4,082,991  4/1978  Constant ........................... 365/160

Primary Examiner—Stuart N. Hecker
Attorney, Agent, or Firm—Thomas J. Kilgannon, Jr.

[57] ABSTRACT

For storing digital data e.g. in magnetic vortex shift registers, a single flux quantum vortex is injected into a superconductive layer by a vortex generator consisting of an emitter and a transfer station. The emitter generates a pool of vortices. The transfer station upon a signal transfers one single vortex at the time. In a particular embodiment, the transfer station consists of a Josephson interferometer at the entrance of a transfer channel. Switching of the interferometer passes a flux vortex from a vortex pool to a shifting and storage apparatus. Other embodiments do not use interferometers but include transfer channels with separation corners and vortex spacing means which insure that upon application of appropriate signals one and only one vortex is passed from the vortex pool to the shifting and storage means.

25 Claims, 12 Drawing Figures

MAGNETIC VORTEX GENERATOR WITH A VORTEX POOL AND SINGLE VORTEX TRANSFER

BACKGROUND OF THE INVENTION

This invention relates generally to apparatus for generating, moving and storing of flux vortices and specifically relates to apparatus for generating, moving, shifting and storing of single flux quantum vortices in a superconducting environment. Still more specifically it relates to a vortex generator which supplies a plurality of single flux quantum vortices to a pool and to transfer means for causing only one flux vortex at a time to be transferred from the vortex pool. The transfer means includes channeling means which insures the passage of only one flux quantum at a time when appropriate currents are applied to the transfer means and a transport or shifting means.

DESCRIPTION OF THE PRIOR ART

Devices for storing and processing digital data in which magnetic single-flux quantum vortices are used as carriers of information are known in the art. The vortices are sorted and transported by means of magnetic fields in a thin layer of a superconductor of the second kind which is operated in the Shubnikoff phase. Reference is made to M. H. Cohen: Superconductivity in Science and Technology, Chicago and London, 1968, pages 4, 5 and 12. Further reference is made to D. Fishlock: A Guide to Superconductivity, London and New York, 1969, pages 18 through 23 and 36 through 37.

Practical embodiments of the above-mentioned devices are also known. These devices comprise a storage medium, which consists of a thin superconductive layer, means for feeding, transporting and reading out of the vortices. For example, the U.S. Pat. No. 3,201,765 filed Aug. 16, 1963 describes apparatus in which vortices are generated in a tin-lead layer by a magnetic winding. The German published patent application 2,455,718 describes generation of vortices by a magnetic winding in a superconductive niobium layer. This method of generating vortices is quite simple and effective. In practice it has been found difficult, however, to generate reliably single vortices in a superconductive layer. The necessary conditions must be met very precisely, otherwise several vortices at a time are frequently generated, thereby causing disturbance and uncertainty of stored information.

As is obvious from the art, single-flux quantum vortex storages are analogous in several respects to magnetic bubble domain memories where information is stored in the form of mobile magnetic domains in a thin layer. Also here, means are required for generating, transporting and reading out the magnetic bubble domains. A magnetic bubble generator appears in conjunction with a storage medium in FIG. 8 of U.S. Pat. No. 3,778,788 filed Nov. 24, 1972. The conditions for generating magnetic bubbles, however, are not comparable in all respects with those for generating vortices. Magnetic bubbles may be made large or small, as desired, and may also be divided, whereas the single-flux quantum is of a given natural magnitude. The teaching on which the magnetic bubble generator described in the mentioned patent is based, therefore, is not suggestive of the solution to the problem underlying the present invention.

It is, therefore, an object of this invention to provide a vortex generator which, upon an external signal, will produce one and only one single-flux quantum vortex in a superconducting layer.

Another object of the present invention is to provide a vortex generator which requires moderate precision of the controlling signals.

Still another object is to provide a generator which can be made easily and at low cost, preferably in the planar technology as is known for superconductive data processing elements. These objects are realized by an emitter producing a pool of vortices and a separate transfer element which delivers one single vortex from the pool upon a control signal.

The foregoing and other objects, features and advantages of the invention will be apparent from the following more particular description of preferred embodiments of the invention as illustrated in the accompanying drawings.

DESCRIPTION OF PREFERRED EMBODIMENTS

Data processing apparatus working with magnetic vortices in type II superconductors is based on the fact that magnetic flux can penetrate a superconductor in the form of locally limited flux quanta. These flux quanta are each generated and surrounded by an eddy or vortex of electric current in the superconductor and the magnetic flux is of the amount $2.07 \cdot 10^{-15}$ Vs. The vortices can be moved under the influence of a transport current in the magnetic field when they are subjected to the Lorentz force which acts perpendicularly to the direction of the transport current as well as on the axis of the magnetic field lines of the vortex. The Lorentz force transports the vortices across the superconductor. The vortices, therefore, can enter at the edge of the superconductor layer, can progress within the layer and can leave it at the opposite edge.

Figure 1:
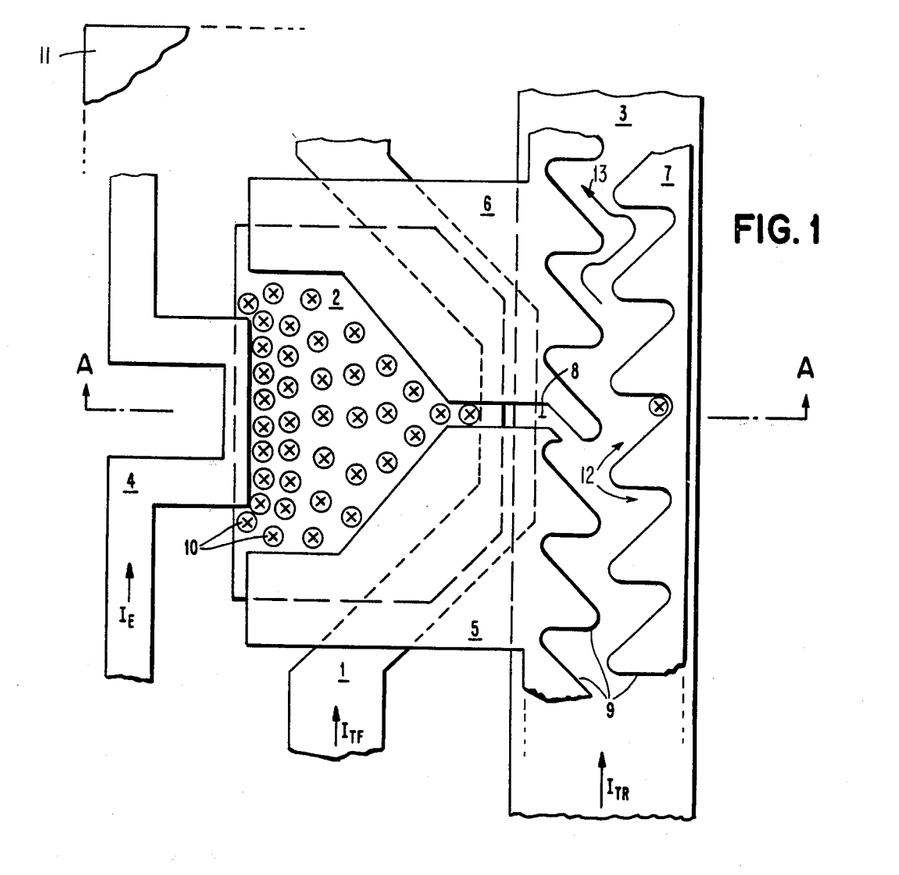
FIG. 1 is a top view of single-flux quantum generating, transferring and storing apparatus in accordance with the teaching of the present invention.

The device depicted in FIG. 1 is arranged in a planar form upon a suitable substrate which is not shown. A number of mutually isolated lines of superconductive material are deposited upon the substrate surface. Deposition may be done e.g. from the vapour phase. The substrate may consist of silicon or any other suitable material. The lines may consist of lead indium alloy, niobium or other suitable metals which are capable of superconductivity. Isolation layers which electrically separate the lines may consist of oxides of these metals or other suitable isolation materials. The metallized layers are e.g. made by deposition from the vapour phase, by chemical deposition or another known method. The pattern of lines and layers are commonly made by well-known photolithographic masking and etching techniques. The layers, may, however, be prepared in any other suitable way. Isolation layers may be produced by oxidizing the metal surfaces by cathodic sputter deposition or other known methods.

Figure 2:
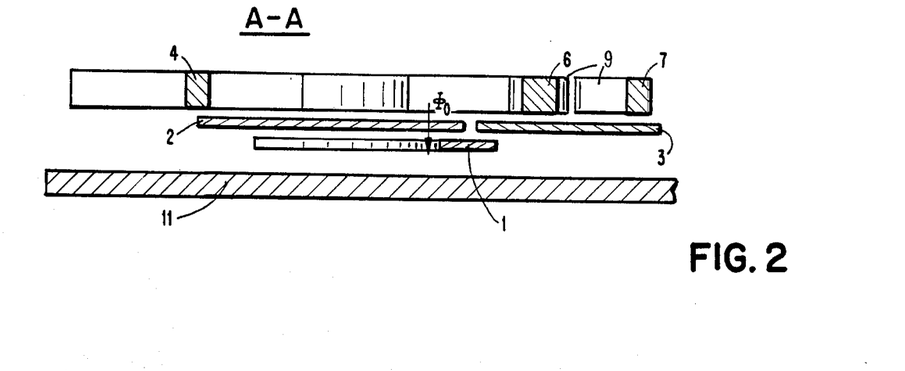
FIG. 2 is a cross-sectional view of the embodiment of FIG. 1.

The structure shown in FIG. 1 may be fabricated as follows: Transfer line 1 is first deposited upon the substrate surface (not shown) and covered with an insulation layer. In a subsequent step, pool layer 2 and transport line 3 are deposited simultaneously. Both cross and partly cover the previously formed transfer line 1 from which they are isolated electrically. In a further step, the emitter line 4 as well as the retaining guiding layers 5, 6 and 7 are produced simultaneously. A section of the emitter line 4 covers a part of the outer edge of the pool layer 2 from which it is isolated. Transfer channel 8 is defined by guiding layers 5, 6 and extends from pool layer 2 across transfer line 1 terminating above transport line 3. Guiding layers 5, 6 and 7 have sawtooth-like transport portions 9, disposed above the transport line 3. For better understanding, the structure of the device is now explained by means of the cross-sectional view along line A-A depicted in FIG. 2. The drawing does not represent the actual size and dimensions, but is greatly extended particularly in the vertical direction. For better clearness, only superconductive layers are shown in addition to substrate 11 and interposed isolation layers are omitted. In operation, an impulse of current $I_E$ flowing in the direction indicated by the arrow on emitter line 4 will induce one or several vortex currents in the pool layer 2, each of which represents one flux quantum 10. The flux quanta separate from emitter line 4 and flow into layer 2, thus building up a supply pool of vortices. Since layer 2, like all conductors in the device, is superconducting, vortices 10 will persist permanently and the pool layer 2 will always contain a sufficient number of vortices for further use in the device.

Vortices 10 depicted in FIG. 1 contain a cross or X sign which indicates that the magnetic dipoles are directed downwards in the plane of the drawing. This direction depends upon the direction of the current $I_E$ in emitter line 4 and would be opposite where the current $I_E$ flows in the opposite direction. The relation between current flow in the various lines and direction of the magnetic dipoles as well as their motion and transport is well known to those skilled in the art and needs no further explanation here. Vortices 10 in pool layer 2 are highly mobile. They are also mutually repellent due to their magnetism. Furthermore, vortices 10 prefer a location of minimal energy and, therefore, concentrate in the center of the surface which is delimited firstly by emitter line 4 and secondly by retaining layers 5 and 6. The density of vortices will be highest in the vicinity of the emitter and will decrease in the region of the funnel which leads to the transfer channel 8. At the entrance of transfer channel 8, therefore, a single vortex is always available. A current impulse $I_{TF}$ of suitable magnitude and direction flowing in transfer line 1 produces a magnetic field which causes a vortex 10 in the funnel closest to the line to travel down the transfer channel 8 and come within the region of influence of transport line 3. Vortex 10 in transfer channel 8 is then influenced by transport current $I_{TR}$ and travels into the closest recess 12 formed by portions 9 of guiding layers 5-7. The direction of the current is chosen so that the vortex travels into one of recesses 12 formed by portion 9 of layer 7. Since recesses 12 are connected by the sawtooth-like portion 9 of guiding layers 5-7, a change of direction of the current $I_{TR}$ causes vortex 10 to travel along portions 9 towards the top of FIG. 1, as indicated by arrow 13.

Obviously, a binary value can be attributed to recesses 12 formed by portions 9 and it is e.g. defined that the presence of a vortex 10 in a particular recess 12 symbolizes a binary one, while the absence of a vortex 10 symbolizes a binary zero. The embodiment of FIG. 1 relates to a shift register for binary information and the vortex generator thereof serves as a write-in station for the shift register. Suitable read-out stations which are needed to complete the shift register are not part of the present invention; such stations are known from the publications and patents mentioned previously.

Figure 3:
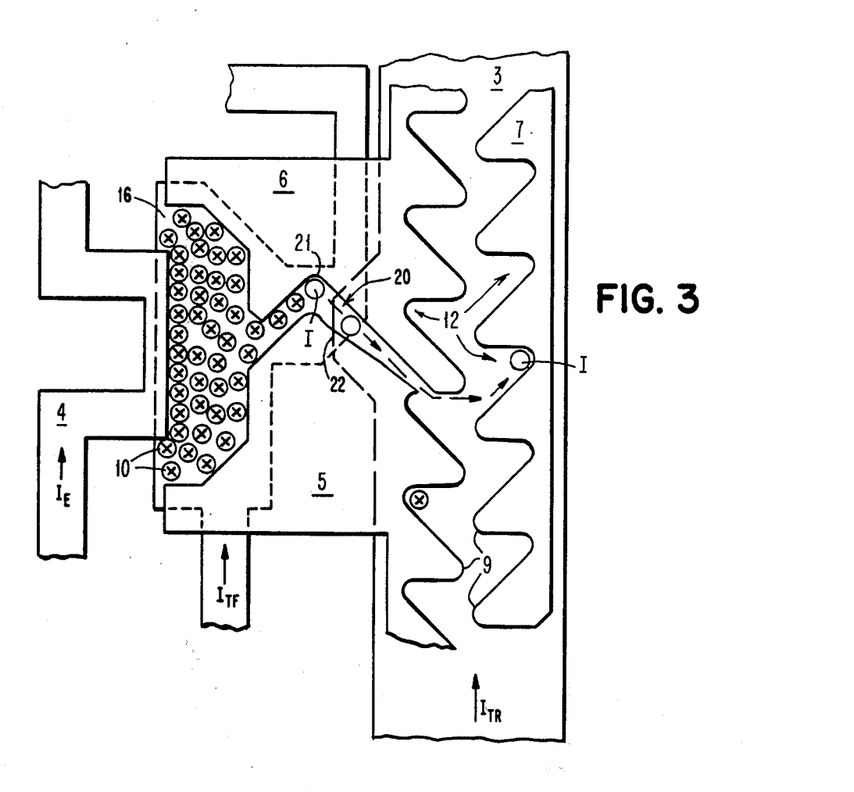
FIG. 3 is a top view of a second embodiment showing a separation corner in the transfer channel.

FIG. 1 depicts a relatively simple embodiment. In practical work, rather close tolerances of transfer pulse $I_{TF}$ are required for transferring one single vortex at the time. The embodiment depicted in FIG. 3 avoids the difficulty without additional expense. The structure of the device depicted in FIG. 3 is more or less similar to that of FIG. 1 and it is sufficient to describe only those parts that are different. The current in transfer line 1 is closely adjacent to pool layer 2 and, as isolation is not needed, both are united into a single layer 16. Transfer channel 8 of FIG. 1 is shown with a bend in FIG. 3 and is identified thereon as channel 20. Channel 20 includes a separation corner 21 so that the transfer current $I_{TR}$ can influence a single vortex 10 only at a time when the vortex appears at the separation corner 21. The emitter current pulse $I_E$ is adjusted so that vortices 10 available in pool layer 16 constitute a rather dense cloud. This causes single vortices to be pressed into channel 20 up to separation corner 21. Now a first vortex, designed by I in FIG. 3 is moved by the magnetic field of the transfer current $I_{TR}$. It should be noted that a portion of layer 16 extends below channel 20 while a protrusion 22 of transport line 3 overlaps a portion of channel 20 such that upon coincidence of transfer current $I_{TF}$ and transport current $I_{TR}$, a sufficiently strong magnetic field is produced which push the vortex I from separation corner 21 along channel 20 into recess 12.

Figure 4:
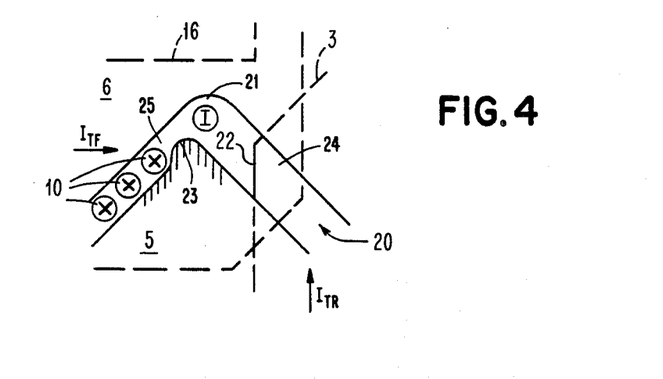
FIG. 4 shows a modification of the embodiment of FIG. 3 which includes a constriction in the transfer channel to space flux vortices.

The above-described embodiment will become more clear by referring to FIG. 4. In FIG. 4, an arrow labelled $I_{TF}$ shows the approximate direction of the transfer impulse $I_{TF}$ which together with the transport impulse $I_{TR}$ produces a field which presses the vortex I out of separation corner 21 into the zone of influence of transport line 3. To further reduce the precision requirement for the control signals, a nose 23 may be employed. Nose 23 provides a constriction of transfer channel 20 immediately before separation corner 21 and thereby providing suitable distance between the vortex I in corner 21 and the next subsequent one. The magnetic field produced by coinciding currents $I_{TF}$ and $I_{TR}$ is effective in portion 24 of channel 20 and therefore acts only upon the vortex I. Other vortices 10 which remain in portion 25 of channel 20 cannot be influenced by the magnetic field. Only after vortex I has been pushed into transport line 3, will the next vortex pass into separation corner 21 under the pressure of the vortex cloud in the vortex pool. Obviously, it is necessary to shape the transport impulse so that it alone cannot move a vortex 10 out of separation corner 21 without coincidence of the transfer impulse.

Figure 5:
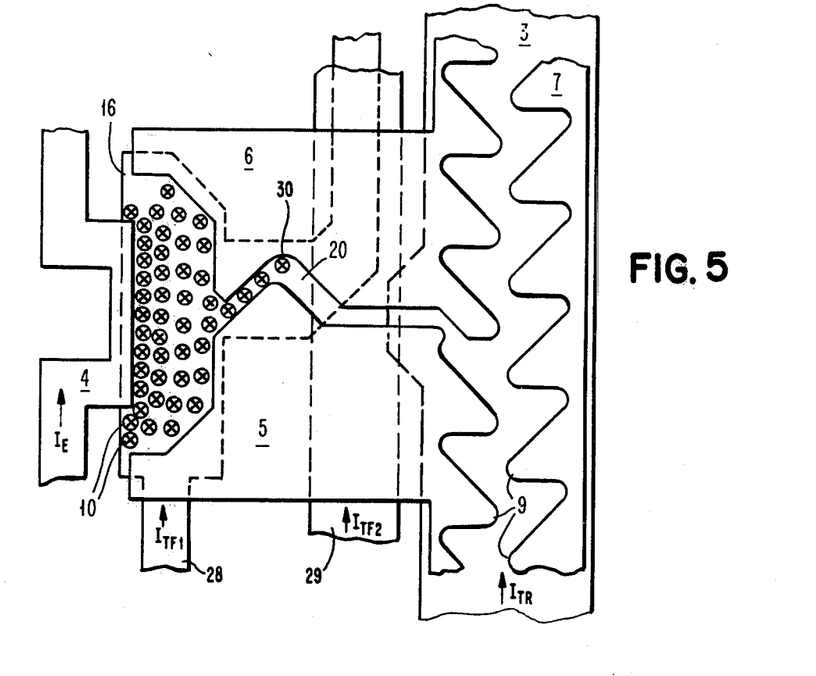
FIG. 5 shows a third embodiment which includes two transfer lines.
Figure 6:
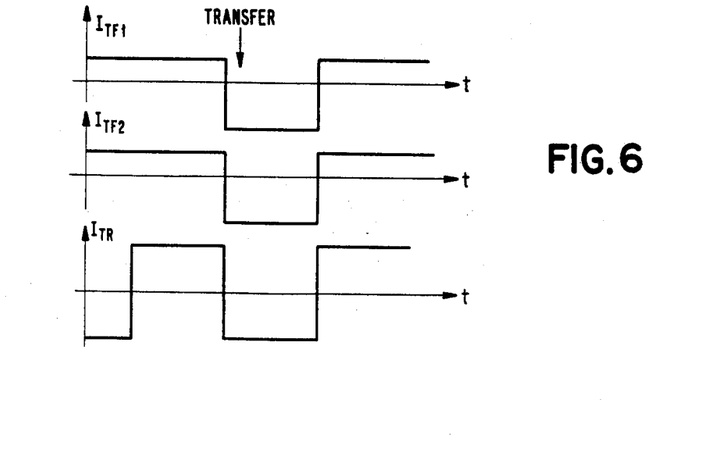
FIG. 6 is a plot of the current against time of the signals used to operate the embodiment of FIG. 5.

In applications where the requirement for the geometrical tolerances in the embodiments described hitherto are still unsatisfactory, the embodiment according to FIG. 5 may be employed. Two different transfer lines 28 and 29 are provided here. The current $I_{TF1}$ in line 28 of layer 16 pushes vortices 10 from the funnel into transfer channel 20 and up to the separation corner 30. $I_{TF1}$, however, counteracts further progress. Only its coincidence with $I_{TF2}$ and $I_{TR}$ will push the first vortex out of separation corner 30 and into the region of influence of transport line 3. FIG. 6 depicts the signal relations plotted against time and shows the coincidence of $I_{TF1}$, $I_{TF2}$ and $I_{TR}$.

Figure 7A:
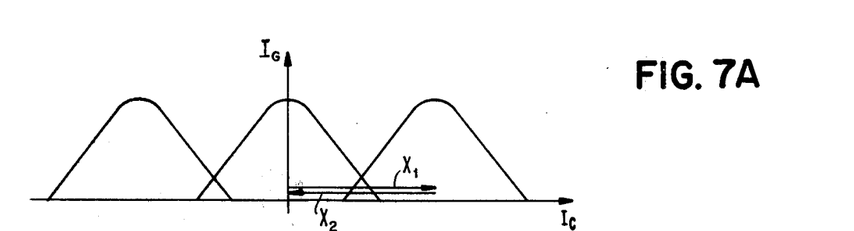
FIG. 7A shows the control characteristics of an interferometer which is shown schematically in FIG. 7B.
Figure 7B:
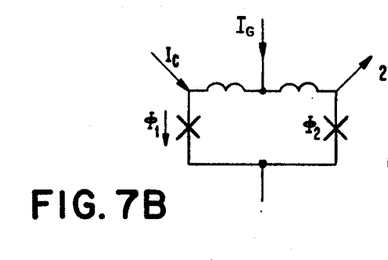
FIG. 7B including 7C, is a schematic of a symmetrically fed two junction interferometer which can be switched by the application of a control current, $I_c$ in conjunction with an applied gate current, $I_G$.
Figure 7C:
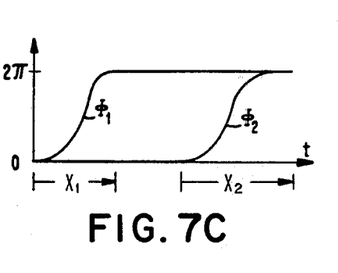

A still further embodiment of the inventive vortex generator employs an interferometer with Josephson junctions. These interferometers are known in the art and reference is made e.g. to R. C. Jaclevick, J. Lamberg, J. E. Mercereau, A. H. Silver, Physical Review, 150 A 1628, November, 1965. It will now be explained how this element can be used for the transfer of a single vortex under the control of two current pulse signals. FIG. 7A shows the control characteristic of the interferometer shown schematically in FIG. 7B. In FIG. 7A, the maximum supercurrent $I_{Gmax}$ is plotted against the control current $I_C$. The interferometer of FIG. 7B may in response to control currents assume two different states: For small control currents, it assumes the flux quantum state zero, i.e. the circuit consisting of two Josephson contacts and the interferometer inductance contains no magnetic flux. When a small gate current $I_G$ is applied and the control current is increased, a flux quantum $\Phi_0 = 2.07 \cdot 10^{15}$ Vs will be drawn through the left contact of the interferometer and it assumes a flux quantum state +1. If the control current $I_C$ is now reduced to zero, the flux quantum will leave the interferometer over the right contact. Thus, a single flux quantum has been transported across the interferometer. This arrangement and operation of the interferometer corresponds to that of one cell of a "Flux-Shuttle" shift register concerning which reference is made to T. A. Fulton, R. C. Dynes, P. W. Anderson "The flux shuttle—a Josephson junction shift register employing single flux quanta", Proceedings IEEE, Vol. 61, No. 1, January, 1973, pages 28-35.

Figure 8:
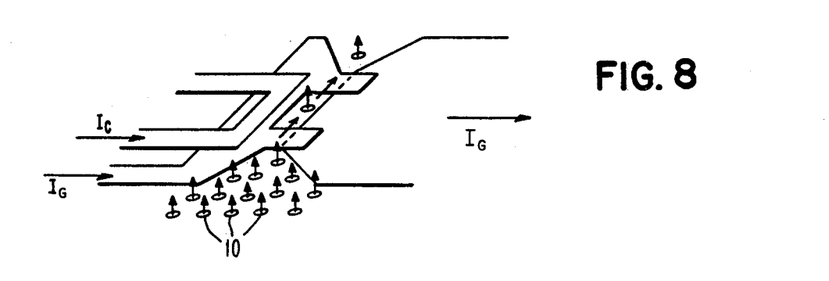
FIG. 8 shows a perspective view of an interferometer which can be utilized in the place of a transfer channel.

FIG. 8 shows in perspective the arrangement of the interferometer in place of the transfer channel. The foreground of the drawing shows the pool of vortices in the vicinity of the emitter line which is not shown. It is immaterial that, contrary to the other drawings, the direction of the vortex dipoles point upwardly relative to the drawing plane. Pulses $I_G$ and $I_C$ are used instead of the two transfer pulses. The following will show that this arrangement in fact can transport vortices. The energy of a vortex in the pool layer of the thickness l is given as:

$$E_v = \frac{l}{2\pi\mu_o} \cdot \frac{\Phi_o^2}{\lambda_L} \cdot \ln\frac{\lambda L}{\xi}$$

whereby $\lambda_L$ is the London penetration depth, $\mu_0$ the permeability of vacuum, $\Phi_0$ one flux quantum, $\xi$ the coherence length of the material and l the thickness of the superconductor in which the vortices exist.

Figure 9:
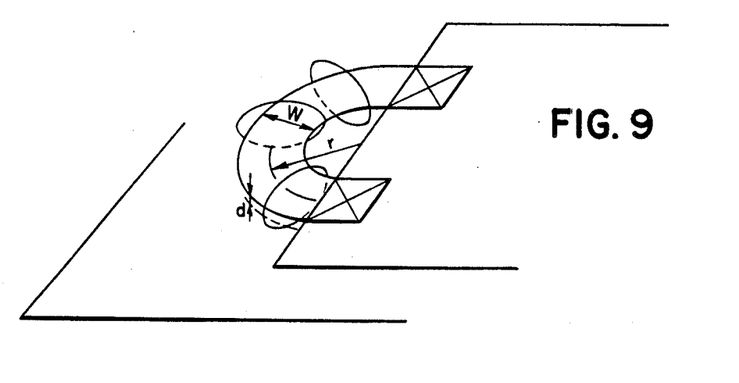
FIG. 9 is a schematic representation of an interferometer showing the various parameters involved in determining the energy of a flux quantum within an interferometer.

The energy of the flux quantum within the interferometer with magnetic field above a ground plane amount to:

$$E_m \cong \frac{\Phi_o^2}{\pi\mu_o} \frac{W}{d}$$

whereby the dimensions W, r, d, which are indicated in FIG. 9 are:
W: the width of the interferometer conductor,
r: the average radius of the interferometer loop,
d: the distance between conductor and ground plate.
If e.g. (W/r)=0.5 and d=l, then $$\frac{E_m}{E_v} \approx \frac{0.5}{\ln\frac{\lambda L}{\xi}}$$

This means that: $E_m < E_v$ for values of $\lambda L/\xi$ of interest.

The above approximation shows that a flux quantum, the field of which is above a ground plane, contains less energy than a flux quantum, the field of which penetrates the ground plane in an eddy current. Thus, it is possible to transport vortices from a pool layer into the Josephson junction of the interferometer if the vortices are under a certain pressure in the direction of transfer.

The force acting upon the vortex when entering the interferometer is estimated as follows: At a lower critical field strength $H_{cl} \approx 100$ A/cm, a transport field of $(H_{cl}/2)$ may be employed. The transfer force is now:

$$F_{TF} \cong \Phi_o \frac{H_{cl}}{2},$$

and the force acting upon the flux quantum when crossing a junction of the interferometer amounts to:

$$F_{INTF} \approx \Phi_0 j_{max} \cdot l.$$

The symbol l signifies the width of the junction orthogonally to the control line and $j_{max}$ the current density. Practical values are e.g. l=5 um and $j_{max}=2$ kA/cm$^2$. The result is:

$$j_{max} \cdot l = 1 \text{ A/cm}.$$

This is equivalent to a force smaller than the pinning force of a vortex. For that reason an additional force has to be available to overcome the pinning force and to press the vortex into the interferometer. This additional force is provided by the magnetic pressure existing within the pool of vortices as well as the Lorentz force which is caused by the current $I_{TR}$. Under the influence of that combined force, a vortex is moved whenever the interferometer due to a suitable control current is ready to accept one.

Figure 10:
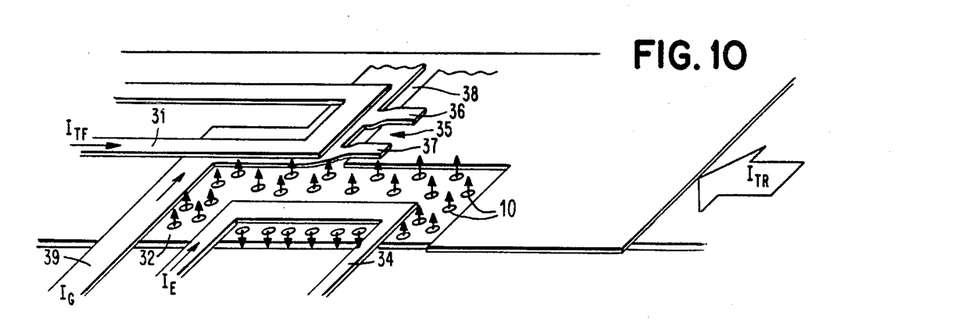
FIG. 10 shows an embodiment of apparatus for generating, pooling, transferring and storing flux vortices which incorporates an interferometer at the entrance to the transfer channel.

FIG. 10 depicts a practical arrangement of a vortex generator with transfer interferometer. The pulse $I_E$ in the emitter line 34 produces a vortex pool in the pool layer 32. Pool layer 32 also serves as ground plane for interferometer 35 and simultaneously as a transport line. The latter conducts the transport current $I_{TR}$. After passing the transfer channel 38 vortices are pushed by $I_{TR}$ depending upon its direction towards one of the guiding layers not shown here. The control line of the interferometer which in FIG. 8 carried the control current $I_C$ now serves as transfer line 31 and carries the transfer current $I_{TF}$. With a bias current $I_G$ flowing in the indicated direction in line 39 and a transfer current $I_{TF}$ rising from zero, a vortex is drawn into interferometer 35. If $I_{TF}$ then decreases to zero, the vortex is expelled into a channel 38. The action of the interferometer compares to the mechanical action of Geneva drive which upon each motion by force transports one and only one ball.

The transport direction of the vortices is dependent upon the direction of $I_G$. This current may flow permanently or may be switched off when no transfer is required.

While the above description concerns only some embodiments, it will be obvious to one skilled in the art that numerous deviations, modifications and different embodiments are possible without departing from the spirit of the invention or from the claims.

What is claimed is:

1. Apparatus for storing single flux quantum vortices comprising:
   means for generating a plurality of single flux quantum vortices having at least one of a given and opposite dipole direction,
   means for pooling said plurality of single flux quantum vortices disposed adjacent said means for generating,
   means for shifting at least one of said plurality of single flux quantum vortices, and
   means for transferring said plurality of single flux quantum vortices one at a time from said means for pooling to said means for shifting interconnecting said means for pooling and said means for shifting.

2. Apparatus for storing single flux quantum vortices according to claim 1 wherein said means for generating a plurality of single flux quantum vortices includes at least an emitter line disposed in electromagnetically coupled relationship with said means for pooling.

3. Apparatus for storing single flux quantum vortices according to claim 2 further including means connected to said at least an emitter line for applying an emitter current thereto.

4. Apparatus for storing single flux quantum vortices according to claim 1 wherein said means for pooling includes a superconducting layer disposed in electromagnetically coupled relationship with said means for generating and guiding means disposed over said superconducting layer defining a funnel-like region in said superconducting layer within which said plurality of single flux quantum vortices are retained.

5. Apparatus for storing single flux quantum vortices according to claim 4 wherein said guiding means are made of superconducting material.

6. Apparatus for storing single flux quantum vortices according to claim 1 wherein said means for shifting includes a superconductive transport means disposed adjacent said pooling means and retaining means disposed over said superconductive transport means defining a plurality of recesses within which a single flux quantum vortex can be stored.

7. Apparatus for storing single flux quantum vortices according to claim 6 wherein said transport means further includes means connected to said transport means for applying a transport current thereto.

8. Apparatus for storing single flux quantum vortices according to claim 1 wherein said means for transferring includes channeling means disposed between said means for pooling and said means for shifting for delivering a vortex from said pooling means to said shifting means.

9. Apparatus for storing single flux quantum vortices according to claim 8 wherein said channeling means includes a superconductive transfer element disposed in electromagnetically coupled relationship with a portion of said pooling means and a portion of said shifting means and channel elements disposed over said transfer element defining a transfer channel extending between said pooling means and said shifting means.

10. Apparatus for storing single flux quantum vortices according to claim 8 wherein said channeling means includes channel elements defining a transfer channel extending between said pooling means and said shifting means and a Josephson junction interferometer disposed at the entrance of said transfer channel and means disposed in electromagnetically coupled relationship with said interferometer for switching said interferometer between a zero voltage state and a voltage state to pass a vortex from said pooling means into said shifting means.

11. Apparatus for storing single flux quantum vortices according to claim 8 wherein said channeling means includes a superconductive transfer element integral with said pooling means and disposed in electromagnetically coupled relationship with a portion of said shifting means and channel elements disposed over said transfer element defining a transfer channel extending between said pooling means and said shifting means.

12. Apparatus for storing single flux quantum vortices according to claim 11 wherein said channel elements include a separation corner in said transfer channel and a protuberance disposed before said corner for spacing said flux vortices.

13. Apparatus for storing single flux quantum vortices according to claim 8 wherein said channeling means includes a first superconductive transfer element integral with said pooling means, a second superconductive transfer element disposed in electromagnetically coupled relationship with a portion of said shifting means and channel elements disposed over said transfer elements defining a transfer channel extending between said pooling means and said shifting means.

14. Apparatus for storing single flux quantum vortices according to claim 13 wherein said channel elements are shaped to form a separation corner in said transfer channel.

15. A magnetic vortex generator for delivering single flux quantum vortices into a superconductive layer characterized by emitter means for generating a plurality of single flux quantum vortices having at least one of a given and opposite dipole direction, pooling means for pooling said plurality of single flux quantum vortices and transfer means for transferring said plurality of single flux quantum vortices from said pooling means connected to said pooling means.

16. A magnetic vortex generator according to claim 15 wherein said emitter means for generating a plurality of single flux quantum vortices includes at least an emitter line disposed in electromagnetically coupled relationship with said pooling means.

17. A magnetic vortex generator according to claim 15 wherein said pooling means includes a superconducting layer disposed in electromagnetically coupled relationship with said emitter means and guiding means disposed over said superconducting layer defining a funnel-like region in said superconducting layer within which said plurality of single flux quantum vortices are retained.

18. A magnetic vortex generator according to claim 17 wherein said guiding means are made of superconducting material.

19. A magnetic vortex generator according to claim 15 wherein said means for transferring includes channeling means coupled to said pooling means for delivering a vortex from said pooling means.

20. A magnetic vortex generator according to claim 19 wherein said channeling means includes a superconductive transfer element disposed in electromagnetically coupled relationship with a portion of said pooling means and channel elements disposed over said transfer element defining a transfer channel extending from said pooling means.

21. A magnetic vortex generator according to claim 19 wherein said channeling means includes channel elements defining a transfer channel extending from said pooling means and a Josephson junction interferometer disposed at the entrance of said transfer channel and means disposed in electromagnetically coupled relationship with said interferometer for switching said interferometer between a zero voltage state and a voltage state to pass a vortex from said pooling means.

22. A magnetic vortex generator according to claim 19 wherein said channeling means includes a superconductive transfer element integral with said pooling means and channel elements disposed over said transfer element defining a transfer channel extending between said pooling means and said shifting means.

23. A magnetic vortex generator according to claim 22 wherein said channel elements are shaped to form a separation corner in said transfer channel and a protuberance disposed before said corner for spacing said flux vortices.

24. A magnetic vortex generator according to claim 19 wherein said channeling means includes a first superconductive transfer element integral with said pooling means, a second superconductive transfer element disposed in electromagnetically coupled relationship with said channeling means and channel elements disposed over said transfer elements defining a transfer channel extending from said pooling means.

25. A magnetic vortex generator vortices according to claim 24 wherein said channel elements are shaped to form a separation corner in said transfer channel.

* * * * *